(12) United States Patent
Kobayashi

(10) Patent No.: US 7,209,847 B2
(45) Date of Patent: Apr. 24, 2007

(54) MEASURING APPARATUS WITH A VALIDATION CAPABILITY OF ITS PREVIOUS CALIBRATION

(75) Inventor: Takeshi Kobayashi, Kyoto (JP)

(73) Assignee: Horiba, Ltd., Kyoto (JP)

( * ) Notice: Subject to any disclaimer, the term of this patent is extended or adjusted under 35 U.S.C. 154(b) by 69 days.

(21) Appl. No.: 10/842,659

(22) Filed: May 10, 2004

(65) Prior Publication Data

US 2005/0021271 A1    Jan. 27, 2005

(30) Foreign Application Priority Data

May 15, 2003    (JP)    ............... P2003-138022

(51) Int. Cl.
*G01D 18/00*    (2006.01)
(52) U.S. Cl. ....................................... 702/85
(58) Field of Classification Search ................ 702/85, 702/107, 104, 127, 73; 726/26; 713/200; 700/109, 709; 324/115; 600/551, 324; 250/339.09, 250/349; 73/204.11
See application file for complete search history.

(56) References Cited

U.S. PATENT DOCUMENTS

| | | | | |
|---|---|---|---|---|
| 5,066,859 A | * | 11/1991 | Karkar et al. | 250/339.09 |
| 5,162,725 A | * | 11/1992 | Hodson et al. | 324/115 |
| 5,685,319 A | * | 11/1997 | Marett | 600/551 |
| 6,571,191 B1 | * | 5/2003 | York et al. | 702/107 |
| 6,834,248 B1 | * | 12/2004 | Green et al. | 702/104 |
| 2001/0047216 A1 | * | 11/2001 | Ando | 700/109 |
| 2002/0161291 A1 | * | 10/2002 | Kianl et al. | 600/324 |
| 2004/0148513 A1 | * | 7/2004 | Scott et al. | 713/200 |

FOREIGN PATENT DOCUMENTS

JP    08-193990    7/1996

* cited by examiner

*Primary Examiner*—Bryan Bui
*Assistant Examiner*—Xiuqin Sun

(57) ABSTRACT

An improved measuring apparatus includes a calibration-related data storage section for storing calibration-related data including, at least, user identifiers for identifying users who have calibrated the apparatus, and calibration date and time data indicative of the date and time of calibration. A display output section is operative to fetch data related to the latest calibration from the calibration-related data storage section by reference to the calibration date and time data and then display an indication of a user identified by a user identifier included in the data related to the latest calibration as a calibrator identifiably together with the measurement outcome.

13 Claims, 6 Drawing Sheets

USER DATA

| USER IDENTIFIER | PASSWORD | GRADE |
|---|---|---|

Fig. 5

SELECTION OF OPERATOR

G1

SELECT WITH ↕ KEY

| OPERATOR | KOBAYASHI |
| | ナカニシ |
| | IDA |
| | シミズ |

| NEW REGISTRATION | | DECISION |

MEASURING APPARATUS WITH A VALIDATION CAPABILITY OF ITS PREVIOUS CALIBRATION

BACKGROUND OF THE INVENTION

1. Field of the Invention

The present invention relates to measuring apparatus such as instruments for measuring pH, oxidation-reduction potential, ion concentration, conductivity or the like of water, food and other samples.

2. Description of Related Art

Among so-called water quality measuring apparatus, there is a device which includes a detecting section which is operative to output a potential difference which can occur when a pair of electrodes are brought into contact with a test subject, and a main body operative to display a characteristic value, such as pH or the like, of the test subject determined from the potential difference as a measurement outcome. To enable a valid measurement with this apparatus, calibration needs to be accomplished in advance by using standard solutions wherein the pH values are known.

Since operations related to calibration can be relatively complicated as described in Japanese Patent Laid-Open Publication No. HEI 8-193990, and an incorrect calibration might be made because of mistaking a standard solution for another or following a wrong procedure if a person who is unfamiliar with or has poor knowledge of those operations is required to perform the calibration.

On the other hand, these types of measurements are often directly related closely to monitoring public health or are of particular interest from the viewpoint of the nature of a test subject for measurement and, hence, the outcome of measurement is required to have high reliability.

With conventional measuring apparatus, however, it is frequently difficult to check whether or not an accurate calibration has been made, and hence it is difficult to preclude errors in the measurement outputs due to an erroneous calibration. Therefore, such conventional apparatus cannot meet the data reliability requirement set forth in the FDA 21 CFR Part 11 (on electronic recording and electronic signature).

Accordingly, it is an object of the present invention to provide a measuring apparatus capable of checking upon, at least, the calibrator of the latest calibration at the time of measurement thereby making it easy to preclude measurement errors due to calibration made by an inept calibrator.

SUMMARY OF THE INVENTION

In order to accomplish the above object, an instrument that requires periodic calibration can be provided with a capability to record historical calibration data including the calibrator and date of calibration for future reference. Additionally, the person or persons who are qualified to act as a calibrator can be initially identified before the instrument is enabled to be calibrated by entering security identification data.

The present invention can provide a measuring apparatus including a detecting section having a pair of electrode portions and operative to output a potential difference which occurs when the pair of electrode portions are brought into contact with a test subject for measurement, a main body operative to display a characteristic value of the test subject determined from the potential difference as a measurement outcome is connected to the detecting section, a calibration-related data storage section for storing calibration-related data including, at least, a user identifier for identifying users who have previously made calibrations of the measuring apparatus, including the calibration date and time data indicative of the date and time of calibration and a display output section operative to fetch data related to the latest calibration data from the calibration-related data storage section by reference to the calibration date and time data, and to display an indication of a user identified by a user identifier included in the data related to the latest calibration as the calibrator identifiably together with the measurement outcome.

The term "user identifier", as used herein, is meant to include a code used to identify a specific user in the computer as well as text data or like data indicative of the name or the like of the user or users corresponding to a predetermined code. The expression "to display an indication of a user as a calibrator identifiably", as used herein, means to display an indication of a user in any indicia form which can identify the user, such as the name of the user, a sign related to the user, or the like.

Such a construction is capable of checking at least the calibrator of the latest calibration every time measurement is conducted and hence enables preclusion of measurement errors caused by incorrect calibration made by an inept calibrator. Thus, the apparatus of the present invention makes it possible to improve the reliability of measurement outcomes by providing a required traceability related to a previous calibration of the instrument.

If the apparatus allows unspecified users including calibrators and measurers to use all the functions of the apparatus including the calibration function, date and time setting function, security function, setting/resetting function, and data erasing function, an inept user might establish wrong settings or perform wrong operations, which could make it impossible to ensure the required reliability of the measurements.

To provide a further improvement capability in the reliability of measurement outcomes by avoiding this problem, the measuring apparatus preferably further includes: a user identifier input receiving section for receiving an input of a user identifier identifying a user; and a function range setting section for setting a range of functions which can be used by the user identified based on the user identifier data inputted.

The foregoing and other objects, features and attendant advantages of the present invention will become more apparent from the reading of the following detailed description of the invention in conjunction with the accompanying drawings.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings.

FIG. 4 is an illustration showing a screen layout of an initial screen according to the same embodiment;

FIG. 5 is an illustration showing a data arrangement of user data according to the same embodiment;

FIG. 8 is an illustration showing a data arrangement of measurement-related data according to the same embodiment;

FIG. 9 is an illustration showing a screen layout of a measurement outcome screen according to the same embodiment; and FIG. 10 is an illustration showing a screen layout of a calibration screen according to the same embodiment.

DETAILED DESCRIPTION OF THE PREFERRED EMBODIMENTS

Reference will now be made in detail to the preferred embodiments of the invention which set forth the best modes contemplated to carry out the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Hereinafter, one embodiment of the present invention will be described in detail with reference to the drawings.

Figure 1:
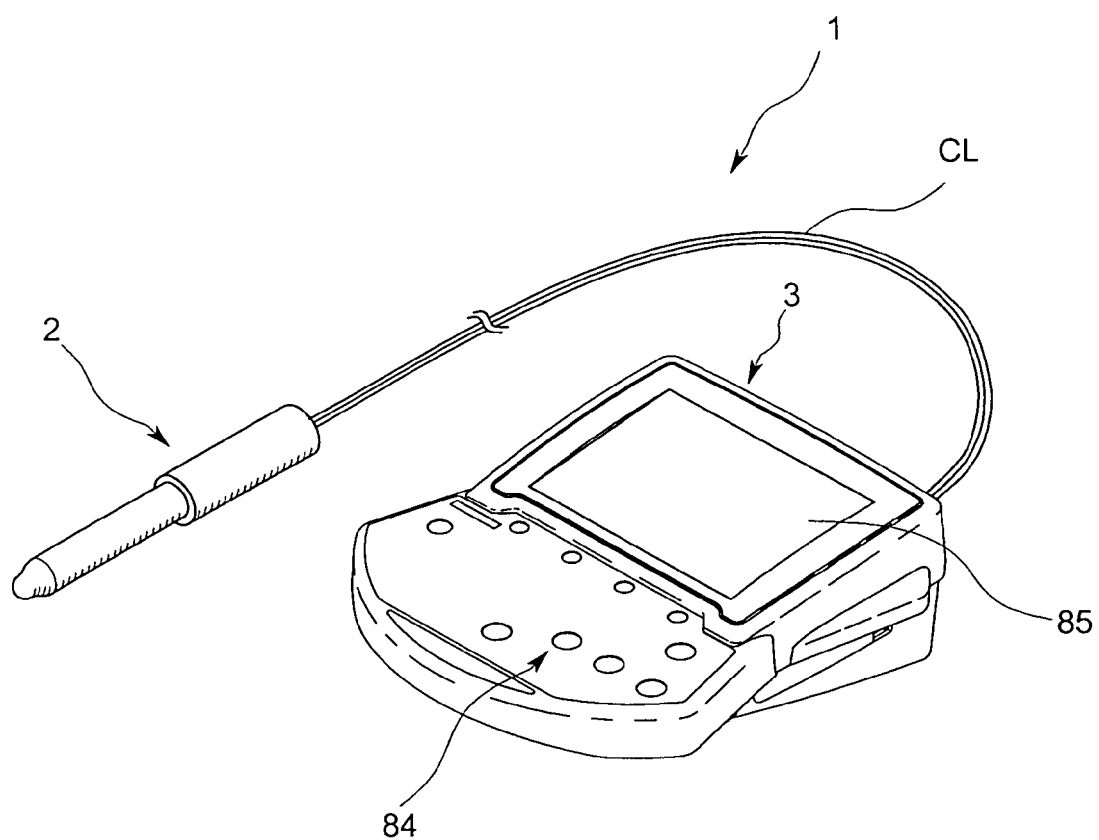
FIG. 1 is a schematic perspective overview showing a measuring apparatus according to one embodiment of the present invention.

Referring first to FIG. 1, there is shown a measuring apparatus or instrument 1 as one embodiment of the present invention, although it should be appreciated that other measuring instruments can be improved by the features of the present invention.

The measuring apparatus 1 includes a probe 2 as a detecting section, and a main body 3 connected to the probe 2 either wirelessly or through a cable CL. The measuring apparatus 1 is configured to measure pH, oxidation-reduction potential, ion concentration, conductivity, or dissolved oxygen of a test subject or sample for measurement and to display a measured value on a display 85 provided on the main body 3. The main body can incorporate a microcomputer and memory, and a stored program can be run to provide various features of the present invention.

Plural types of probe 2 for different measurement purposes can be provided, including a pH measurement probe, oxidation-reduction potential measurement probe, ion concentration measurement probe, conductivity measurement probe, and dissolved oxygen measurement probe, any one of which is selectively connected to the main body 3 depending on the purpose of measurement. This embodiment uses the pH measurement probe 2 as a representative example of such probes.

The pH measurement probe 2 is a so-called "combined electrode" integrally incorporating a glass electrode portion as one electrode portion, a reference electrode portion as the counterpart electrode portion, a temperature compensation electrode portion, and the like, and is known by persons skilled in this field, and accordingly the specific details will be omitted. When the probe 2 is brought into contact with a test subject, the probe 2 outputs a potential difference occurring between the electrode portions as a detection signal. Though the probe 2 shown in FIG. 1 is of the standard type, it is needless to say that the probe 2 may take any number of various forms such as a needle form having a sharpened tip to stick into the interior of food products or the like, and a separate form wherein the glass electrode and a reference electrode are provided separately.

Figure 2:
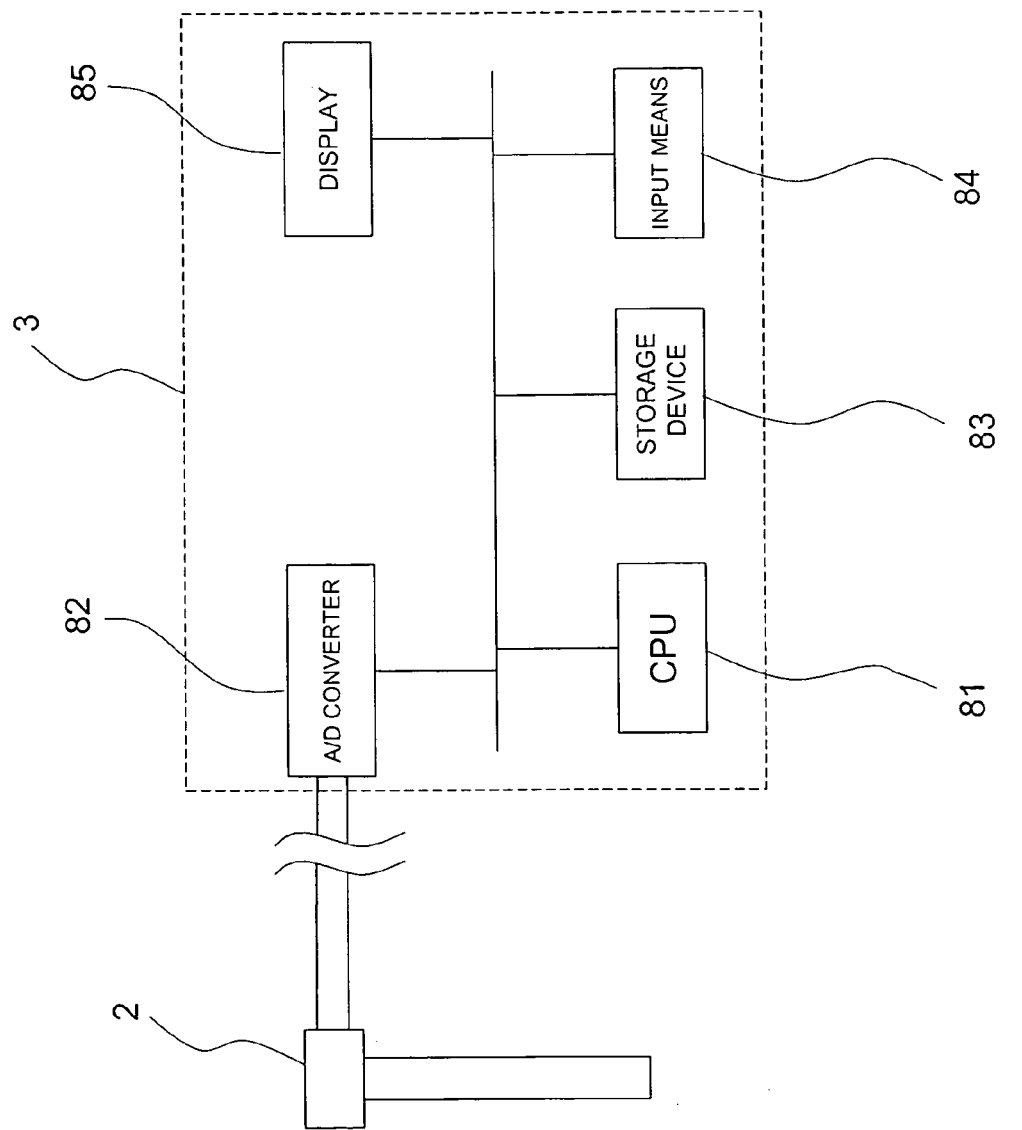
FIG. 2 is a block diagram showing the hardware configuration of the measuring apparatus according to the same embodiment.

As shown in FIGS. 1 and 2, the main body 3 has a hardware configuration including a CPU 81, an A/D converter 82, a storage device 83, an input means 84, a display 85 and the like, and these components can be dedicated to the measuring apparatus 1. The "storage device 83", as used here, is meant to include not only internal memory or like memory but also a removable non-volatile recording medium such as portable small-sized memory. The input means or input controls 84 includes, for example, an ENTER key, cursor key, MEAS key, CAL key or any other known means of entering data including interpreting audio commands of the user.

Figure 3:
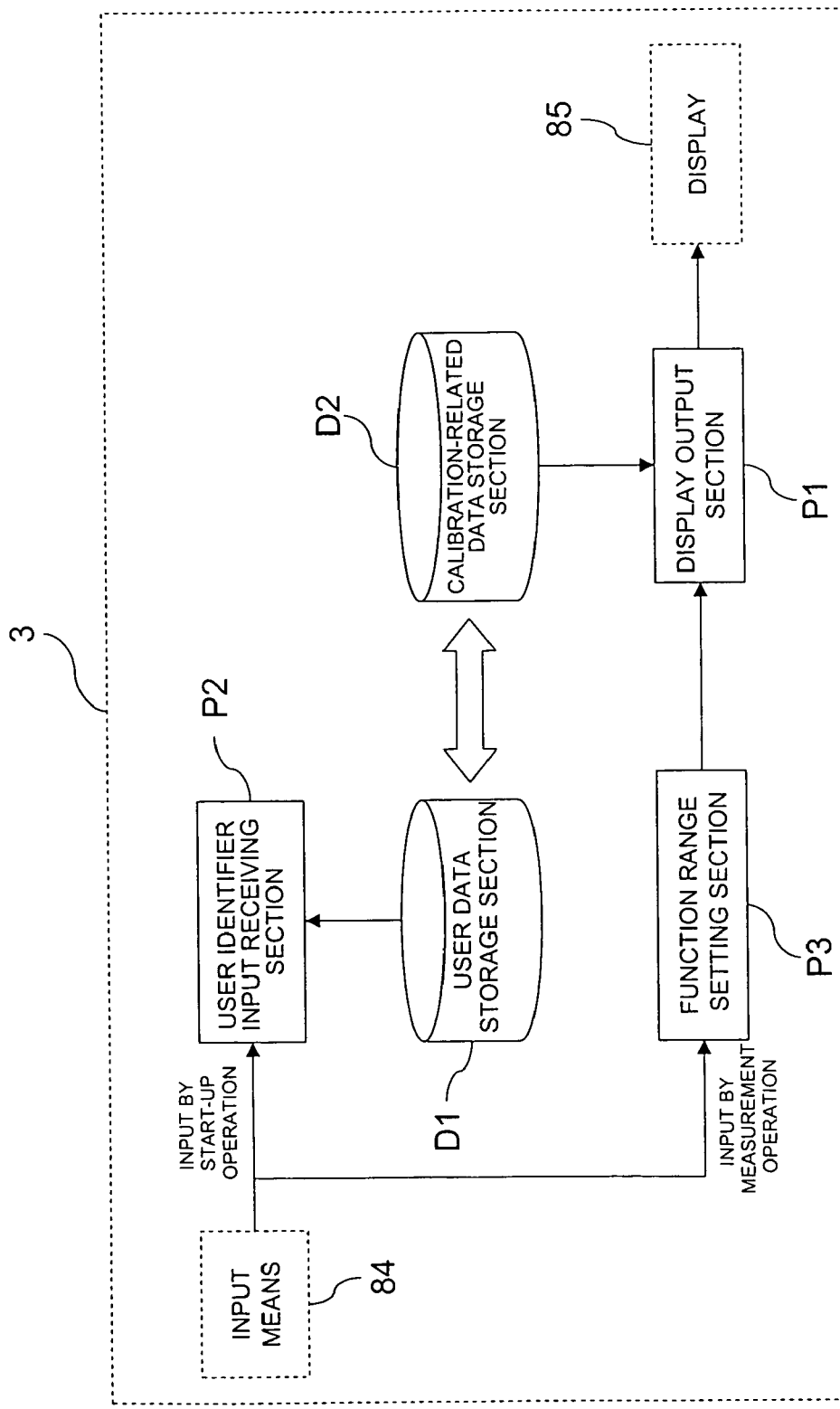
FIG. 3 is a block diagram showing the functional configuration of the measuring apparatus according to the same embodiment.

The CPU 81 and its peripheral devices operate based on programs pre-stored in the storage device 83 so that the main body 3 functions as a user data storage section D1, calibration-related data storage section D2, display output section P1, user identifier input receiving section P2, function range setting section P3, and the like, as shown in FIG. 3.

Description will hereinafter be made of each component of the measuring apparatus 1 together with a description of how to use the apparatus 1.

FIG. 4 shows an initial screen G1 displayed after the apparatus 1 has been powered on. The initial screen G1 displays user identifiers which were fetched from data pre-stored in the user data storage section D1 for selection. The user data storage section D1, which can be established in a predetermined area of the storage device 83, previously stores one or more items of user data indicative of information on each potential authorized user through a certain predetermined registration procedure not shown. For example, a series of menus or display screens can be provided to prompt input from the user. Such procedures can be subjectively established depending on the requirements of a particular instrument and the level of reliability required. The user data can include, for example, a user identifier, password, grade or level of competency and the like, as shown in FIG. 5.

When a user selects his or her name (user identifier) displayed on the initial screen G1 using the cursor key or the like, the user identifier input receiving section P2 receives the input of his or her user identifier and displays a non-illustrated screen requesting entry of his or her password. If the character string inputted at this time is not the same as the corresponding password stored in the user data storage section D1, the main program cannot be started up.

Figure 6:
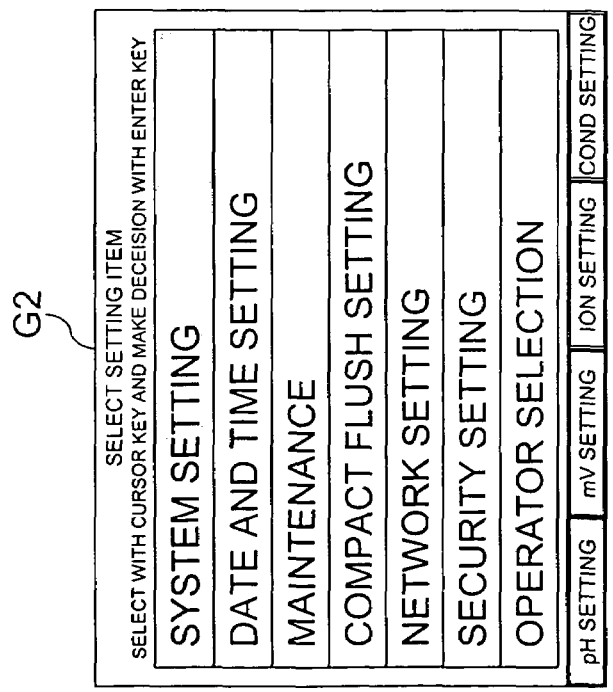
FIG. 6 is an illustration showing a screen layout of a setting screen according to the same embodiment.

After the starting-up of the main program, a setting screen G2 as shown in FIG. 6 is displayed. The user can then input or establish various settings selectively in accordance with the contents displayed on the setting screen G2.

Figure 7:
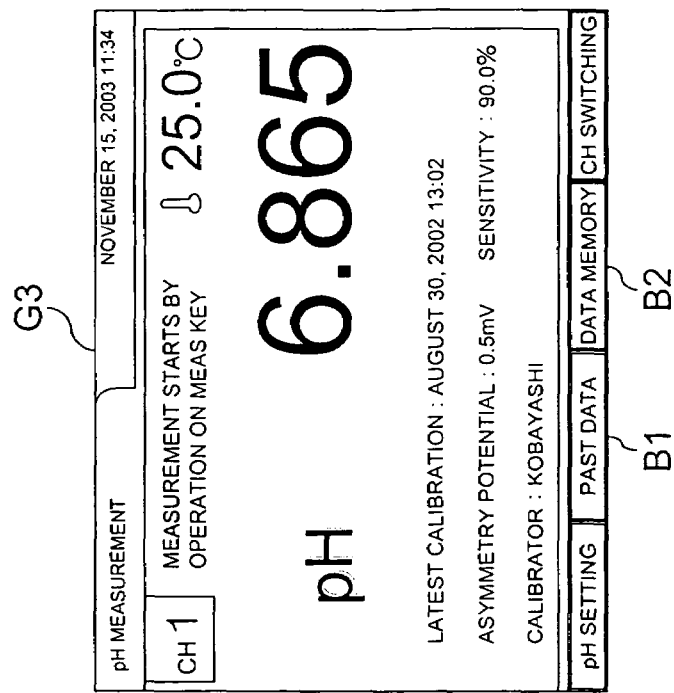
FIG. 7 is an illustration showing a screen layout of a measurement screen according to the same embodiment.

FIG. 7 illustrates a measurement screen G3 displayed at the time of the starting of measurement. Switching to the measurement screen G3 from, for example, the setting screen G2 can be made through a predetermined operation such as an operation on the MEAS key.

The measurement screen G3 displays a measured value along with historical information previously recorded related to the last latest calibration including the name of the calibrator, date and time of the calibration, asymmetry potential, sensitivity, and the like. The asymmetry potential, which is a potential exhibited by the glass electrode, indicates a condition of the glass electrode for maintenance purposes. Maintenance data can be stored to operate with a predetermined algorithm that in response to the calibration procedure can further evaluate the detector unit condition. Likewise, the sensitivity is a value indicating a condition of the glass electrode.

Figures 8, 9, 10:
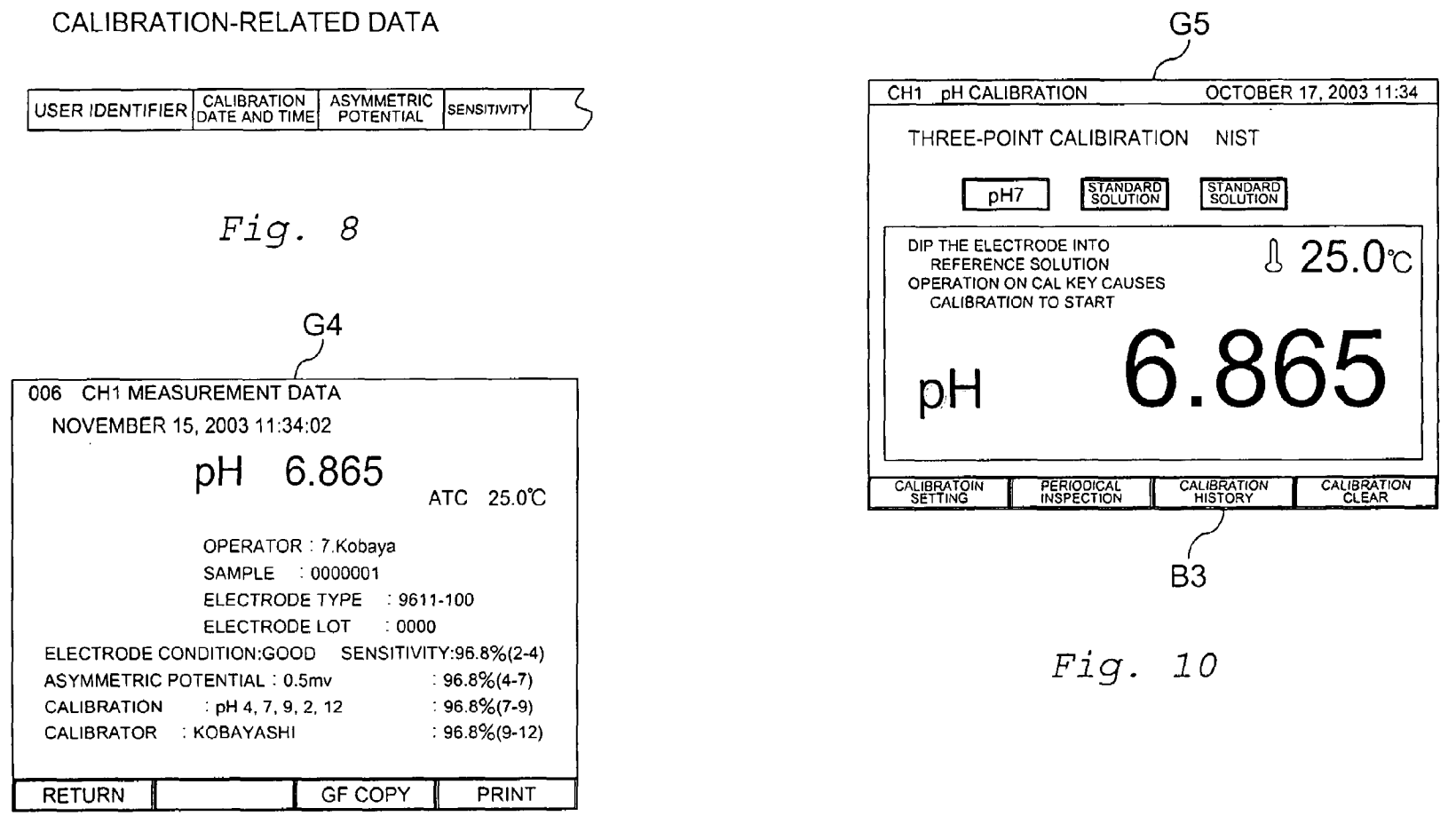

Specifically, at the time of switching to the measurement screen G3, the display output section P1 fetches data related to the latest calibration for pH measurement from the calibration-related data storage section D2 and then displays the name of the calibrator, date and time of the calibration, asymmetry potential, sensitivity, and the like based on the calibration-related data thus fetched. As shown in FIG. 8, the calibration-related data storage section D2 has stored therein one or more items of historical calibration-related data, each data item including a user identifier identifying a calibrator having made a calibration and data on the calibration such as the date and time of the calibration, asymmetry potential, sensitivity and the like. The display output section P1 extracts the data item related to the latest calibration by reference to the calibration date and time data.

Subsequently, measurement is started when the user performs a predetermined operation (operation on the MEAS key) on the measurement screen G3.

On the measurement screen G3 are established a "data memory" button B2, a "past data" button B1 and the like. When the "data memory" button B2 for example is operated, measurement-related data, which includes the user identifier identifying the measurer, measurement date and time data, and measurement outcome data, is automatically generated and then stored in a measurement-related data storage section not shown, while a measurement outcome screen G4 as shown in FIG. 9 is displayed. The measurement outcome screen G4 displays calibration-related information including information on what reference solutions (for example, pH 4, 7, 9, 2 and 12) have been used in the calibration, the value of asymmetry potential, numeric values of sensitivity, and information on plural standard solutions with which the sensitivity has been measured (for example, the indication (4-9) indicates that reference solutions of pH4 and pH9 have been used in the sensitivity measurement.) In addition, the measurement outcome screen G4 displays information on the electrode condition ("good" in FIG. 8) which is evaluated synthetically and automatically from these numeric values based on the stored algorithm. In the measurement outcome screen G4 also, calibration-related information including information on the calibrator is displayed. When the "past data" button B2 on the measurement screen G3 is operated, measurement-related data obtained in the past (not shown) is fetched from the measurement-related data storage section for display.

FIG. 10 illustrates a calibration screen G5. Switching to this calibration screen G5 from, for example, the setting screen G3 can be made by a predetermined operation such as an operation on the CAL key in the setting screen G3.

Calibration can be achieved through predetermined operations according to the contents displayed on the calibration screen G5. After the calibration has been completed, calibration-related data, which includes the user identifier identifying the calibrator and the calibration date and time data, is automatically generated without further control or input from the user and then stored in the calibration-related data storage section D2. On the calibration screen G5 are established a "calibration history" button B3 and the like. When the user operates this "calibration history" button B3 for example, calibration-related data obtained in the past (not shown) is fetched from the calibration-related data storage section D2 for display.

When the user attempts to select any one of various predetermined functions of the apparatus 1 including switching to any one of the aforementioned screens, the function range setting section P3 judges whether or not the user is permitted to use the function thus selected. Specifically, the function range setting section P3 references the value of a grade corresponding to the user identifier and then judges whether or not the function selected by the user falls within the function range defined by the value of the grade. Ranking-related data can be pre-stored and associated with a particular level of skill or authority of the user. If it falls within the function range, the user is permitted to operate that function. If not, the function is disabled for that particular user.

This embodiment has a plurality of grades or levels, the highest one of which (corresponding to a measuring apparatus controller) permits the corresponding user to use all the functions. With lower grades, the user becomes prohibited from using a part or all of the functions including calibration function, date and time setting function, security function, setting/resetting function, data erasing function and the like. For example, only the measuring apparatus controller can use the date and time setting function, security function, setting/resetting function and data erasing function. Of course, the measuring apparatus 1 may perform a finer function range setting on a user-by-user basis instead of a grade-by-grade basis.

Since operations similar to those performed in pH measurement are performed in the measurement of any one of oxidation-reduction potential, ion concentration, conductivity and dissolved oxygen, description of measurement of these characteristics is herein omitted.

According to this embodiment, the measurement screen G3 displays, in addition to information on the current measurement, data related to the latest calibration forming the basis for the current measurement, namely, the date and time of the latest calibration, calibrator, asymmetry potential, sensitivity and the like. Thus, measurement can be conducted based on the latest calibration confirmed to be correct, which leads to improved reliability of measurement outcomes. Additionally, the operator or calibrator aware of this capability of the measuring instrument will have an incentive to properly conduct his/her job function because of this traceability.

Besides being capable of setting a usable function range user by user, the measuring apparatus 1 can reference information on past measurers and calibrators, which was automatically recorded. For this reason, it is possible to prevent tampering with the data of any erroneous setting and operations, which also leads to improved reliability of measurement outcomes.

With regard to the calibration function in particular, if a measured value is determined by computation based on an incorrect calibration, an incorrect measurement outcome is outputted undesirably, which results in considerably lowered reliability of measurement. It is very effective in preventing this problem that use of the calibration function is restricted in accordance with the ability of the user to disable the calibration function to be used by those who are unfamiliar with or have poor knowledge of calibration.

It should be noted that the present invention is not limited to the foregoing embodiment. For example, the screen layout of each screen or the procedure for switching to each screen is not limited to that employed in the foregoing embodiment. The measuring apparatus may have an integral configuration in which the probe and the main body are integrated together.

As has been described in detail, the present invention is capable of checking at least the calibrator of the latest calibration every time a new measurement is conducted and hence enables preclusion of measurement errors caused by incorrect calibration made by an inept calibrator. Thus, the present invention makes it possible to improve the reliability of measurement outcomes and to provide automatically a validation capability of previous calibrations.

While only certain presently preferred embodiments of the present invention have been described in detail, as will be apparent for those skilled in the art, certain changes and modifications may be made in embodiments without departing from the spirit and scope of the present invention as defined by the following claims.

Those skilled in the art will appreciate that various adaptations and modifications of the just-described preferred embodiment can be configured without departing from the scope and spirit of the invention. Therefore, it is to be understood that, within the scope of the amended claims, the invention may be practiced other than as specifically described herein.

What is claimed is:

1. A measuring apparatus comprising:
   a detecting section having a pair of electrode portions and operative to output a potential difference which occurs when the pair of electrode portions are brought into contact with a test subject for measurement;
   a main body removably attachable to the detecting section and displaying a characteristic value of the test subject determined from the potential difference on a measurement screen on the main body as a measurement outcome;
   a calibration-related data storage section in the main body for storing calibration-related data including, at least, user identifiers for identifying users who have previously calibrated the apparatus, and a calibration date and time data indicative of the date and time of the previous calibration; and
   a display output section in the main body operative to fetch data related to a latest calibration from the calibration-related data storage section by reference to the calibration date and time data and then display an indication of a user identified by a user identifier included in the data related to the latest calibration as a calibrator identifiably together with the measurement outcome simultaneously on a same screen as the measurement screen.

2. The measuring apparatus according to claim 1, further comprising:
   a user identifier input receiving section on the main body for receiving an input of a user identifier identifying a user; and
   a function range setting section in the main body for setting a range of functions which can be used by the user identified by the user identifier inputted.

3. The instrument of claim 1 further including stored operation instructions for the user that are displayed concurrently with the historical calibration data.

4. The instrument of claim 1 wherein the current operational characteristic of a probe is displayed on the display screen during calibration.

5. The instrument of claim 1 wherein the relative sensitivity of a probe is displayed on the display screen.

6. An instrument which requires calibration to maintain reliability comprising:
   a detecting unit for performing a measurement on a test subject and providing a representative output signal;
   a controller unit for processing the output signal to provide a measurement output including input controls and a calibration-related data storage section for storing calibration-related data including user data setting forth user information enabling the controller unit to operate when a predetermined user code is entered by the input controls and a ranking-related data storage section to store a level of operation permitted by a predetermined user, the controller unit processing the ranking-related data associated with the predetermined user code to enable the instrument to a corresponding level of operation including automatically entering and storing calibrated data associated with a specific user as historical calibration data to insure traceability of the calibration of the instrument; and
   a display screen for displaying indicia of the representative output signal and the stored historical calibration data when the instrument has been enabled to permit the predetermined user to calibrate the instrument,
   wherein the detecting unit measures pH and the controller unit displays asymmetry potential of the detecting unit on the display screen during measurement.

7. The instrument of claim 6 further including maintenance data that is used to calculate the operative status of the detecting unit in response to the input of the stored calibration data.

8. An instrument which requires calibration to maintain reliability, comprising:
   a main body with a display screen;
   operator input members for entering data on the main body including a user identifier;
   a probe attached to the main body for contacting a test subject and providing a measurement signal; and
   a controller unit in the main body for processing the measurement signal to provide a measurement output including a calibration-related data storage section for storing calibration-related data including user data setting forth user information enabling the controller unit to operate when a predetermined user identifier is entered by the input members and a ranking-related data storage section to store a level of operation permitted by a predetermined user, the controller unit processing the ranking-related data associated with the predetermined user identifier to enable the instrument to provide a corresponding level of operation including automatically entering and storing calibrated data associated with a specific user as historical calibration data to ensure traceability of the calibration of the instrument and displaying the historical calibration data created by the identified specific user with the current calibration measurement output on the same display screen.

9. The instrument of claim 8 wherein the probe measures pH and the controller unit displays an asymmetry potential of the probe on the display screen during calibration.

10. The instrument of claim 8 further including stored operation instructions for the user that are displayed concurrently with the historical calibration data.

11. The instrument of claim 8 wherein the current operational characteristic of the probe is displayed on the display screen during calibration.

12. The instrument of claim 8 wherein the relative sensitivity of the probe is displayed on the display screen.

13. An instrument which requires calibration to maintain reliability comprising:
   a probe for contacting a test subject and providing a measurement signal; and
   a controller unit for processing the measurement signal to provide a measurement output including input controls and a calibration-related data storage section for storing calibration-related data including user data setting forth user information enabling the controller unit to operate when a predetermined user code is entered by the input controls and a ranking-related data storage section to store a level of operation permitted by a predetermined user, the controller unit processing the ranking-related data associated with the predetermined user code to enable the instrument to a corresponding level of operation including automatically entering and storing calibrated data associated with a specific user as historical calibration data to insure traceability of the calibration of the instrument; and a display screen for displaying indicia of the measurement signal and the stored historical calibration data when the instrument has been enabled to permitting the predetermined user to calibrate the instrument and wherein the probe measures pH and the controller unit displays asymmetry potential of the probe on the display screen during measurement.

* * * * *